United States Patent
Kern et al.

(10) Patent No.: US 9,989,567 B2
(45) Date of Patent: Jun. 5, 2018

(54) METHOD OF MEASURING THE ENERGY CONSUMPTION OF THE BRANCHES OF AN ELECTRICAL NETWORK AND MEASUREMENT EQUIPMENT IMPLEMENTING SAID METHOD

(71) Applicant: SOCOMEC, Benfeld (FR)

(72) Inventors: Christian Kern, Sigolsheim (FR); Marc Capot, Kintzheim (FR)

(73) Assignee: SOCOMEC, Benfeld (FR)

( * ) Notice: Subject to any disclaimer, the term of this patent is extended or adjusted under 35 U.S.C. 154(b) by 0 days. days.

(21) Appl. No.: 15/125,983

(22) PCT Filed: Mar. 27, 2015

(86) PCT No.: PCT/FR2015/050792
§ 371 (c)(1),
(2) Date: Sep. 14, 2016

(87) PCT Pub. No.: WO2015/150670
PCT Pub. Date: Oct. 8, 2015

(65) Prior Publication Data
US 2017/0097379 A1    Apr. 6, 2017

(30) Foreign Application Priority Data
Apr. 1, 2014    (FR) ..................... 14 52851

(51) Int. Cl.
*G01R 21/133*    (2006.01)
*G01R 19/25*    (2006.01)
*G01R 27/20*    (2006.01)
(52) U.S. Cl.
CPC ....... *G01R 21/133* (2013.01); *G01R 19/2509* (2013.01); *G01R 27/20* (2013.01)
(58) Field of Classification Search
CPC ... G01R 21/133; G01R 19/2509; G01R 27/20
See application file for complete search history.

(56) References Cited

U.S. PATENT DOCUMENTS

| 6,330,516 B1 | 12/2001 | Kammeter |
| 6,459,257 B1 | 10/2002 | Köck |

(Continued)

FOREIGN PATENT DOCUMENTS

| EP | 0 853 364 A2 | 7/1998 |
| EP | 1 010 015 B1 | 7/2002 |

(Continued)

OTHER PUBLICATIONS

International Search Report Corresponding to PCT/FR2015/050792 dated Jul. 6, 2015.

(Continued)

*Primary Examiner* — Bryan Bui
(74) *Attorney, Agent, or Firm* — Davis & Bujold PLLC; Michael J. Bujold

(57) ABSTRACT

Equipment (1) for measuring the energy consumption of branches (11-N) of an electrical network (10) which comprises a single voltages measuring device (2) connected upstream of the branches of the network so as to measure the voltages of the network in a centralized manner, and several dedicated current measuring devices (3) connected to each branch of the network so as to measure the currents on the branches of the network. The measuring devices (2, 3) are connected by network cable (6) allowing digital communication of the voltage measurements to the current measuring devices (3), which comprises a processing unit (33) for calculating the energy consumption of the analyzed branch of the network. The voltage and current measurements are performed by sampling, and the sampling frequencies are compared and adjusted automatically so as to synchronize the current samples with the voltage samples.

28 Claims, 4 Drawing Sheets

(56) References Cited

U.S. PATENT DOCUMENTS

| | | | |
|---|---|---|---|
| 7,236,897 B2* | 6/2007 | Gandhi | G01R 21/133 324/142 |
| 8,554,501 B2 | 10/2013 | Diop et al. | |
| 9,500,714 B2* | 11/2016 | Rotem | G01R 21/133 |
| 2012/0271576 A1 | 10/2012 | Kamel et al. | |

FOREIGN PATENT DOCUMENTS

| | | |
|---|---|---|
| EP | 2 000 780 A1 | 12/2008 |
| FR | 2872291 A1 | 12/2005 |
| JP | 2009-008580 A | 1/2009 |
| WO | 98/11641 A2 | 3/1998 |
| WO | 2010037988 A1 | 4/2010 |

OTHER PUBLICATIONS

Written Opinion Corresponding to PCT/FR20151050792 dated Jul. 6, 2015.

International Report on Patentability Corresponding to PCT/FR2015/050792 dated Mar. 9, 2016.

\* cited by examiner

METHOD OF MEASURING THE ENERGY CONSUMPTION OF THE BRANCHES OF AN ELECTRICAL NETWORK AND MEASUREMENT EQUIPMENT IMPLEMENTING SAID METHOD

TECHNICAL SCOPE

This invention relates to a method for measuring the energy consumption of the branches of an electrical network, method in which one measures the voltages of said network in a centralized manner by means of a single voltages measuring device connected upstream of the branches of the network, one measures the current on at least one of the branches of the network by means of a dedicated current measuring device, one communicates through a communication link said voltage measurements to said current measuring device, and one calculates in said current measuring device at least said energy consumption of said analyzed branch of the network.

This invention also relates to a measuring equipment implementing the measuring method above, and comprising a single voltages measuring device connected upstream of the branches of the network to be analyzed so as to measure the voltages of said network in a centralized manner, at least one dedicated current measuring device connected to one of the branches of the network so as to measure the currents on said branch of the network, said measuring devices being connected to each other by at least one communication link allowing communicating said voltage measurements to said current measuring device, which comprises at least one processing unit for calculating said energy consumption of said analyzed branch of the network.

PRIOR ART

The increasing demand for electrical consumption reduction linked to energy efficiency problems leads to the almost compulsory implementation of very detailed instrumentation in electrical networks so as to be able to identify the origin of electricity consumptions, to follow the evolution of these consumptions, to take measures to reduce these consumptions and to evaluate the impact of the consumption reduction actions. Measuring an electrical energy consumption on a branch of an electrical network imposes the simultaneous measurement of the voltages and of the currents circulating in this branch. Multiplying voltage taps shows two major disadvantages:
  the size and price of the protections required for the voltage taps, and
  the size and price of the voltage measuring circuits in the measuring devices.

These two disadvantages represent an important barrier to the multiplication of the energy analysis equipment.

Now, if one limits oneself to an electrical distribution switchboard, one notes that the voltage is approximately the same at all points of this switchboard. As a result, it seems interesting to share or to centralize the voltage tap upstream to analyze the consumption of all branches of the network distributed by this electrical switchboard.

Even though the accuracy of power measurements does not need to be very good for a consumption distribution analysis, proper evaluation of the consumed power variations is however important, which implies a low phase shift between current measurements and voltage measurements. For example, if one notes that an electrical motor is oversized and operates with a very low power factor, which generates high energy consumption, and one replaces it with a motor with lower power operating with a much higher power factor, a too high phase error in the measurements may lead to the determination of much lower consumption reduction than expected. As an example, a phase error of 0.3° represents a power measurement error in the order of 1% for a power factor of 0.50. The multiplication of non-linear electronic loads also results in the presence of powers linked to the current and voltage harmonics. Hence the accurate analysis of these harmonic powers imposes a synchronization quality even higher than that required for power measurement on the network. Therefore, a system for analyzing energy consumptions must show a phase error between currents and voltages as low as possible, typically in the order of 0.1° at 50 Hz, which represents approximately 5 µs at 50 Hz.

Finally, the implementation of such measuring equipment must be as simple as possible, in particular regarding wiring, as well as the proper association between the voltages measuring circuits and the currents measuring circuits in a three-phase network and the integration of these measurements in existing supervision units.

The most commonly used solution for analyzing the consumptions of multiple branches of an electrical network consists in installing measuring devices comprising both voltage measuring circuits and current measuring circuits. These measuring devices are generally connected to each other by a communication link that is itself connected to a supervision unit. The major drawback of this solution is the need to make multiple connections intended for measuring the voltages on all branches of the network, while these connections must in addition be protected by fuses for safety reasons. Often, these fuses are almost as large as the measuring device itself. Furthermore, these voltages measuring circuits take a relatively large space in the measuring device because of the clearances to respect between hazardous live conductive parts, both between the different polarities and with respect to the conductive parts accessible to a user.

Publication U.S. Pat. No. 6,330,516 B1 describes a solution offering one single voltage tap and a relatively high number of current sensors. This approach meets partly the problems posed above, as only one voltage connection is carried out. Nevertheless, the measuring device becomes relatively large because of the high number of inputs for the current sensors and for the associated electronics. Furthermore, the conditioning and processing electronics must be dimensioned so as to be able to process the maximum number of current sensors intended to be connected, and this reduces the economic interest of this solution if not all measuring channels are used. Moreover, the concentration of the multiple current sensor connection cables in one single point makes wiring, as well as its verification, very complicated Publication EP 0 853 364 A2 describes an equipment provided with a voltage measuring device and multiple current measuring devices connected to each other by a communication link. In this equipment, the voltage measuring device transmits regularly the amplitudes and the phase of the measured voltages, and the current measuring devices calculate the power using the equation $P=U \times I \times \cos \Phi$. This method has the disadvantage that it does not consider the harmonics.

Publication EP 1 010 015 B1 describes an equipment of the same type, without indicating clearly which type of information is transmitted to the current measuring devices in addition to the voltage.

Therefore these existing solutions are not satisfactory.

DESCRIPTION OF THE INVENTION

The present invention aims to overcome these disadvantages by offering an economical solution, suited to the real needs of the electrical network to be analyzed, particularly simple to implement thanks to a very simplified wiring, allowing a synchronization of the measured voltage and current samples in the order of 1 µs, that is to say ensuring an excellent metrological quality despite the possible presence of harmonics.

To that purpose, the invention relates to a method of the kind stated in the preamble, characterized in that one performs the measurements of the voltages of said network by sampling the voltages at a first sampling frequency, one performs the measurements of the current of the branch of the network by sampling the currents at a second sampling frequency, one compares the time difference existing between the sampling moments of the voltages and of the currents and one adjusts at least one sampling frequency with respect to the other to bring the time difference existing between the sampling moments of the voltages and of the currents close to zero.

In a preferred embodiment, the voltages measuring device transmits the voltage samples on the communication link at a sampling moment $T_{v,n}$ using an information frame of duration D, the current measuring device receives these voltage samples and detects the moment of the end of the reception of said information frame $T_{rec,n}$, then it calculates the sampling moment $T_{v,n}$ of the voltage samples and the time difference $\Delta T_n$ between the currents sampling moment $T_{i,n}$ and the voltages sampling moment $T_{v,n}$ to adjust its own sampling frequency in order to bring this time difference close to 0 by increasing the sampling frequency if the time difference $\Delta T_n$ is positive and reducing it if the time difference $\Delta T_n$ is negative.

The voltages measurement device advantageously transmits the voltage samples on the communication link with a fixed delay R with respect to the voltages sampling moment $T_{v,n}$ using an information frame of a known duration D. In this case, the current measurement device calculates the voltages sampling moment $T_{v,n}$ from the known data D and R according to the formula: $T_{v,n}=T_{rec,n}-D-R$, and calculates the time difference $\Delta T_n$ between the currents sampling moment $T_{i,n}$ and the voltages sampling moment $T_{v,n}$ according to the formula $\Delta T_n=T_{i,n}-T_{v,n}=T_{rec,n}-D-R$.

One can use the communication link to transmit from said voltages measuring device to said current measuring device additional information chosen in the group comprising the single-phase or three-phase network type, with or without neutral, the rated voltage of the network, the rated frequency of the network, date and time, synchronization pulses of effective and power values measurements, event capture signals.

According to the case, one can transmit the voltage measurement samples in packets of N samples. One can also choose a sampling frequency for the voltages measurements that is fixed or controlled by the frequency of the analyzed electrical network.

One preferably transmits the voltage measurement samples in digital form on a network cable connected to the current measuring device, this network cable comprising at least a first pair of conductive wires called unidirectional communication pair.

One can advantageously use the same network cable to provide an electrical power supply to said measuring devices using a second dedicated pair of conductive wires called power supply pair.

One can additionally use the same network cable to connect the measuring devices to a monitoring unit by means of a third dedicated pair of conductive wires called bidirectional communication pair.

In a first application, one can measure the voltages of the electrical network with respect to a reference potential formed by the earth of said network. In this case, one can inject an earth fault current in the analyzed network, one can measure said injected fault current and one can so determine the earth leakage impedance of at least one of the branches of said analyzed network.

In a second application, the current measuring device can supply an auxiliary signal representative of the voltage of the conductor on which the current is measured, said auxiliary voltage signal being in this case used for matching the voltage measurement with the current measurement performed on a same conductor of said electrical network and compensate automatically for connection errors.

In a third application, the current measuring device can also measure the local voltage on said network branch to calculate locally at least said energy consumption and compare it with said energy consumption calculated from the centralized voltage measurements, thus allowing to evaluate the energy losses in said network.

In a fourth application, one can use at least one other voltages measuring system connected to another electrical network to be analyzed. In this case, one transmits to one of the voltages measuring devices the voltage measurement samples obtained by the other voltages measuring device through said communication link, and one compares the amplitude and the phase of both analyzed electrical networks to connect them together when said differences are sufficiently low.

When both electrical networks are connected together, any one of the voltages measuring devices takes the control of the communication link and is used for measuring the voltages of said corresponding network.

Also to that purpose, the invention relates to an equipment of the kind stated in the preamble, characterized in that the voltages measuring device comprises means to perform the voltage measurements by sampling the voltages at a first sampling frequency, in that the current measuring device comprises means to perform the current measurements by sampling the currents at a second sampling frequency, means to compare the time difference existing between the sampling moments of the voltages and of the currents, and in that said voltages and current measuring devices comprise means to adjust at least one sampling frequency with respect to the other to bring the time difference existing between the sampling moments of the voltages and of the currents close to zero.

In a preferred embodiment of the invention, the voltages measuring device comprises at least one adjustable oscillator arranged to define the sampling frequency of the voltage measurements and at least one processing unit arranged to process at least said voltage samples.

The voltages measurement device can moreover comprise a frequency module arranged to measure the frequency of the analyzed network, the processing unit being arranged to process also the network frequency measurements. In this case, the adjustable oscillator can be controlled by the processing unit according to the network frequency.

In the preferred embodiment, the current measuring device comprises at least one adjustable oscillator arranged to define said current measurement sampling frequency and at least one processing unit arranged to calculate at least the energy consumed by said branch of the network from the voltage samples received through the communication link and from the current samples measured on said branch.

The current measuring device can moreover comprise a phase shift module arranged to measure the time difference existing between the voltages sampling moments and the currents sampling moments and to control the adjustable oscillator in order to adjust the current measurements sampling frequency so as to synchronize it with the voltage measurements sampling frequency.

The communication link can be made of at least one pair of conductive wires called unidirectional communication pair provided in a network cable to transmit the voltage samples in digital form, this network cable being arranged to connect said centralized voltages measuring device to said dedicated current measuring device through suitable connectors.

Additionally, the network cable can comprise a second dedicated pair of conductive wires called power supply pair arranged to provide an electrical power supply to said measuring devices.

The network cable can also comprise a third dedicated pair of conductive wires called bidirectional communication pair arranged to connect said measuring units to a monitoring unit.

In a first embodiment variant, the measuring equipment can comprise means for injecting an earth fault current in the analyzed network. In this case, the current measuring device comprises a sensor arranged to measure said earth fault current and the processing unit is arranged to determine the earth leakage impedance of said analyzed branch of said network based on the voltage samples received through the unidirectional communication pair and from the earth leakage current samples measured locally.

In a second embodiment variant, the current measuring device can comprise an auxiliary voltage sensor arranged to measure an auxiliary signal representative of the voltage of the conductor on which said device measures the current, the processing unit comprising in this case a correlation module arranged to match the voltage measurement with the current measurement performed on a same conductor of said electrical network.

In a third embodiment variant, the current measuring device can moreover comprise a voltage sensor to measure the local voltage on said analyzed branch of the network, the processing unit being in this case arranged to calculate locally at least said energy consumption and compare it with said energy consumption calculated from the centralized voltage measurements to evaluate the energy losses in the cables of said network.

In a fourth embodiment variant, the measuring equipment can comprise at least one other voltages measuring device connected to another electrical network to be analyzed, this other voltages measuring device being connected to said main network voltages measuring device through said communication link.

The measuring equipment comprises advantageously a number N of dedicated current measuring devices corresponding to the number N of branches of the electrical network to be analyzed, all current measuring devices being connected to said centralized voltages measuring device.

This measuring equipment advantageously comprises at least one line termination device located at the end of said unidirectional communication pair, and at least one connection device located upstream of the branches of the electrical network to be analyzed and arranged to act as the electrical interface between said measuring devices on the one hand and at least a power supply and a supervision unit on the other hand.

BRIEF DESCRIPTION OF THE DRAWINGS

The present invention and its advantages will be better revealed in the following description of an embodiment given as a non-limiting example, in reference to the drawings in appendix, in which.

ILLUSTRATIONS OF THE INVENTION AND BEST WAY OF REALIZING IT

Figure 1:
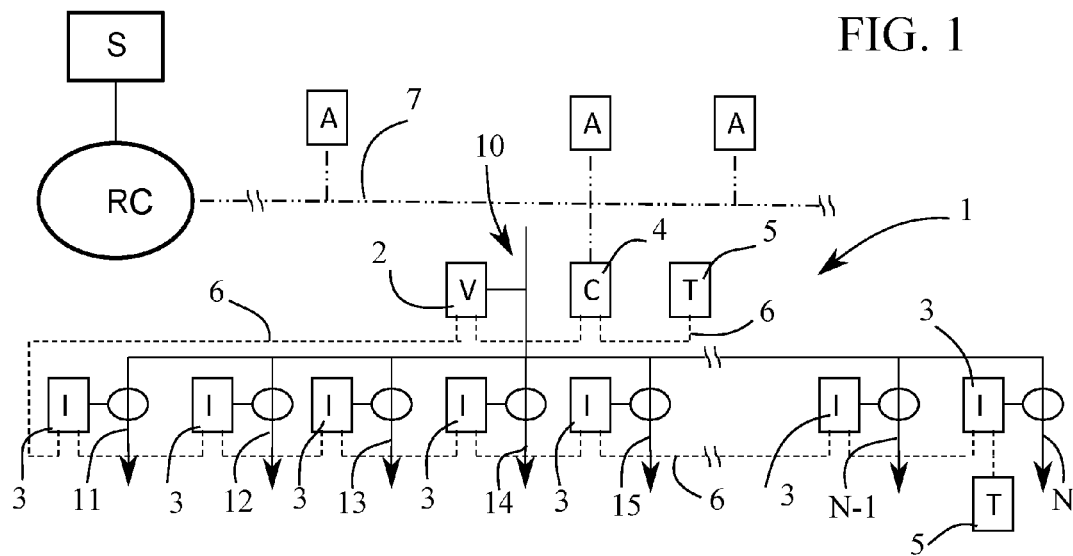
FIG. 1 represents schematically a general view of a measuring equipment according to the invention for an electrical network comprising several branches.

Referring to the figures and more specifically to FIG. 1, measuring equipment 1 according to the invention comprises four major components:
- a device 2 measuring the voltages of an electrical network 10,
- one or several devices 3 measuring the current of branches 11-N of this network 10, each branch powering at least one load (not represented),
- a connection device 4 ensuring the connection of measuring equipment 1 with its external environment, such as for example an electrical power supply 8, a communication bus 7, etc., and
- a line termination device 5 allowing ensuring the quality of signal transmission by terminating the communication lines.

This measuring equipment 1 can be part or not of a more completed system comprising in particular a monitoring unit S and one or several other devices A connected to communication bus 7. This communication bus 7 allows forwarding information in the form of digital signals according to a defined and standardized communication protocol. It can thus be made of a standard communication bus of the RS485 type and of a communication protocol of the JBUS/MODBUS type or similar, and it can be connected directly to monitoring unit S or through a RC communication network of the Internet type or similar. The other connected devices A must be compatible with the communication protocol used. As a non-limiting example, they can be made of an energy counter, a station measuring the parameters of the electrical network, analog and/or digital input and output modules forming the interface with sensors, automata, switchgear or similar, temperature sensors, pressure sensors, as well as any device commonly connected to a field bus, etc.

Advantageously, but not exclusively, the various devices 2-5 are connected serially with each other by chaining network cables 6. These network cables 6 can be made of a standardized network cable, typically a UTP Category 3 network cable, made of four twisted pairs made each of two conductive wires helically wound around each other. Of course, any other network cable type can be suitable. Consequently, each device 2-5 is provided with two eight-position and eight-contact connectors, one input connector 60 and one output connector 61, in accordance with FIGS. 3 and 5. These connectors can be standardized connectors commonly called RJ45 connectors, which allow simple, fast, serial connection of the different devices with each other, this type of connection is commonly called "daisy chain". Of course, any other connector type compatible with the network cable can be suitable.

As mentioned above, any other type of network cable 6 can be suitable, assuming the number of twisted pairs is at least equal to two. In fact, the interest of these network cables 6 lies in the fact that they can forward several signal types in a same cable to simplify wiring as much as possible. Consequently, measuring equipment 1 requires at least:
  a first twisted pair to provide the electrical power supply of devices 2-5 from the network, for example with 24V low voltage, called hereafter "power supply pair 62", and
  a second twisted pair to ensure the unidirectional communication of the voltage signals from voltages measuring device 2 towards current measuring devices 3, called hereafter "unidirectional communication pair 63".

It can be completed, as represented in the figures, by a third twisted pair to ensure the bidirectional communication between devices 2-5 of measuring equipment 1 and monitoring unit S, called hereafter "bidirectional communication pair 64".
In the previously described advantageous case of a network cable 6 with four twisted pairs, the fourth twisted pair (not represented in the figures) can be used in parallel to power supply pair 62 to double the power of the electrical power supply.

Figure 3:
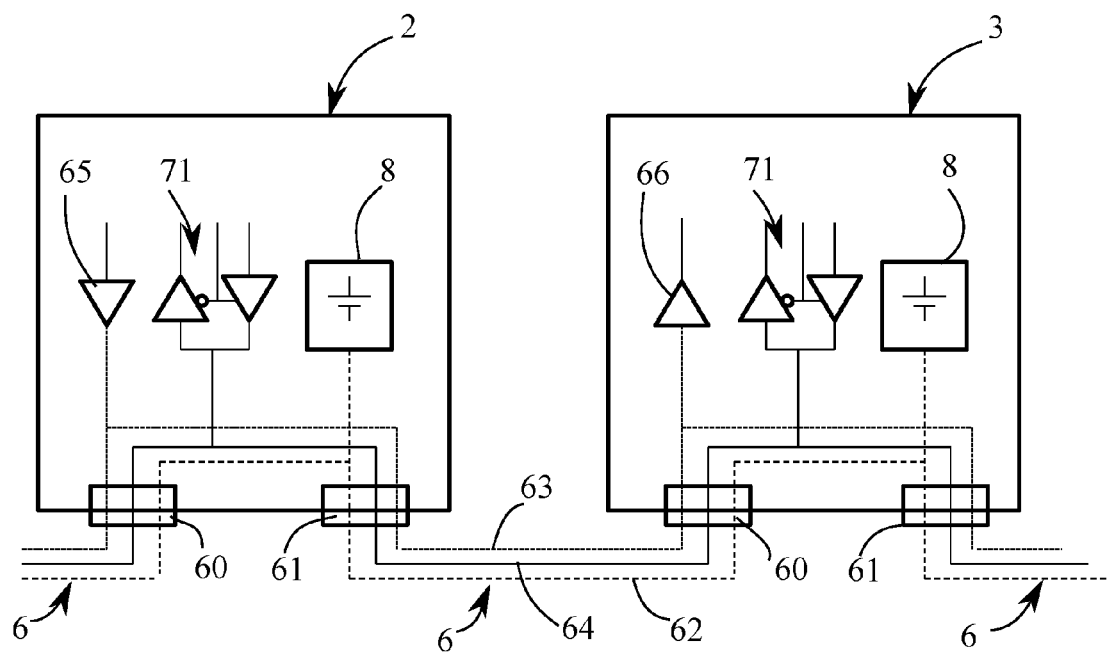
FIG. 3 is a schematic view showing the various power supply and communication links between a voltages measuring device and a current measuring device belonging to the measuring equipment of FIG. 1.
Figure 5:
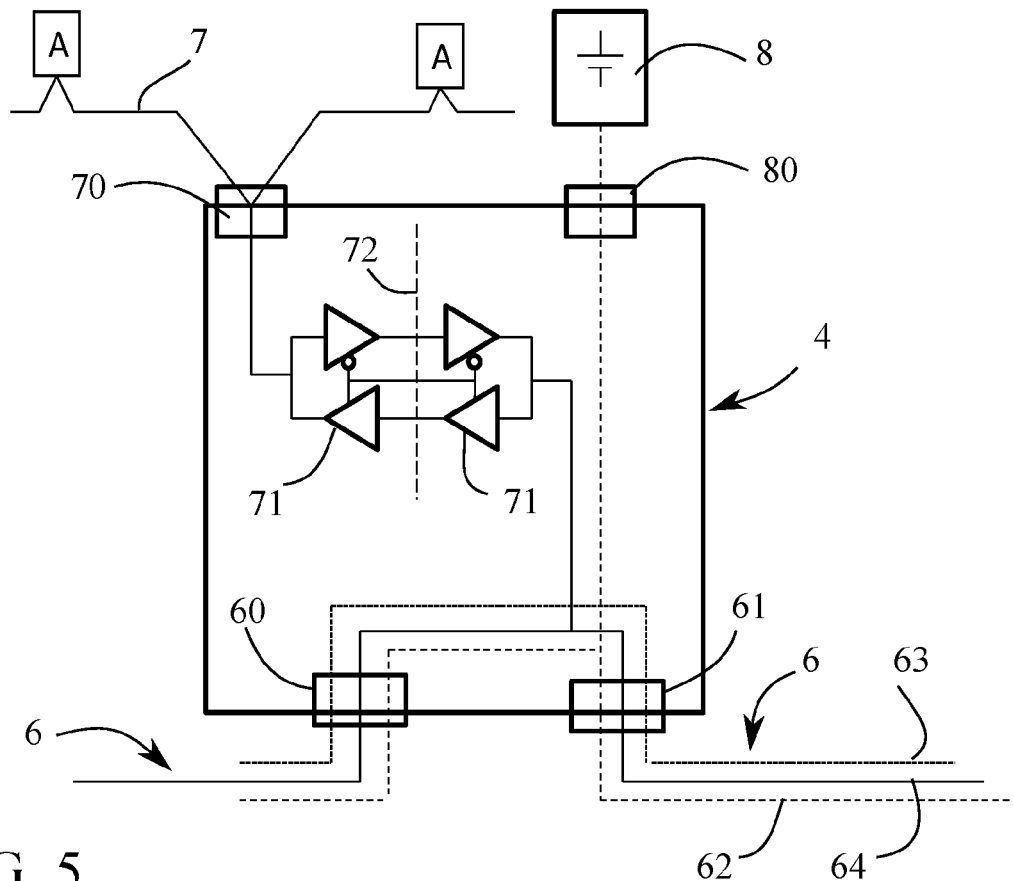
FIG. 5 is a schematic diagram of a connection device belonging to the measuring equipment of FIG. 1, FIGS. 6A and 6B illustrate two implementation examples of the measuring equipment of FIG. 1 respectively on a three-phase network and on a single-phase network.

To allow the various devices 2-5 to communicate with each other through these network connections, each of them is equipped with connectors 60, 61 of the RJ45 type matching the same connectors provided at the ends of network cables 6. They moreover comprise data transmission means in the form of transmitters 65 and receivers 66 associated with unidirectional communication pair 63 and transmitters/receivers 71 associated with bidirectional communication pair 64. FIG. 3 represents a voltages measuring device 2 and a current measuring device 3 connected to each other by a network cable 6 through connectors 60, 61. The network cables 6 represented in the figures are illustrated with three twisted pairs 62, 63, 64. The voltages measuring device 2 comprises an electrical power supply 8 coming from power supply pair 62, a transmitter 65 connected to unidirectional communication pair 63 for transmitting the signals of the measured voltages to current measuring devices 3, and a transmitter/receiver 71 connected to bidirectional communication pair 64. And the current measuring device 3 comprises an electrical power supply 8 coming from power supply pair 62, a receiver 66 connected to unidirectional communication pair 63 for receiving the signals of the measured voltages from voltages measuring device 2, and a transmitter/receiver 71 connected to bidirectional communication pair 64. FIG. 5 represents connection device 4 provided with a connector 80 connected to an electrical power supply 8 of the network for powering power supply pair 62, a connector 70 connected to communication bus 7 for connecting bidirectional communication pair 64 to it through two transmitters/receivers 71 separated by a galvanic isolation 72. The line termination device 5 is not represented as such, since it is made of a known standard element made of a combination of resistors permanently connected to communication pairs 63 and 64. The function of this line termination device 5 is to adapt the impedance of each of the two communication pairs 63 and 64 in order to avoid reflections on network cables 6 and thus ensure good signal transmission quality.

Figure 4:
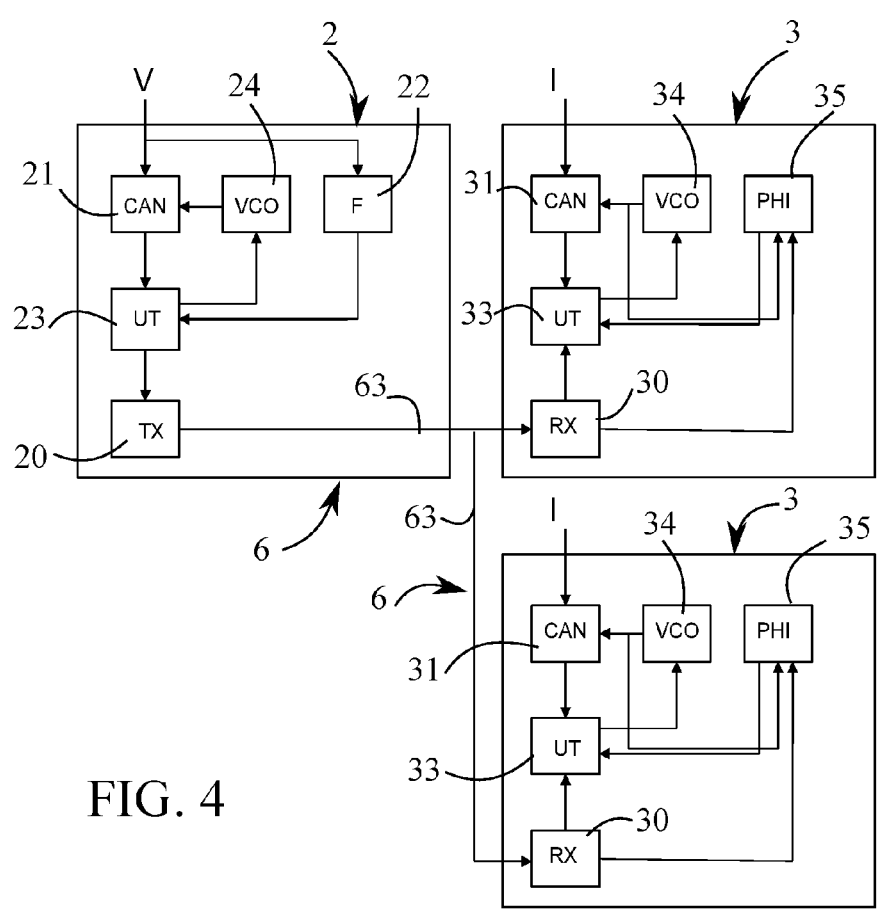
FIG. 4 is a schematic diagram of the voltages measuring device and of two current measuring devices belonging to the measuring equipment of FIG. 1.

FIG. 4 represents the operating principle of measuring devices 2 and 3 in the form of block diagrams.

Figure 6A:
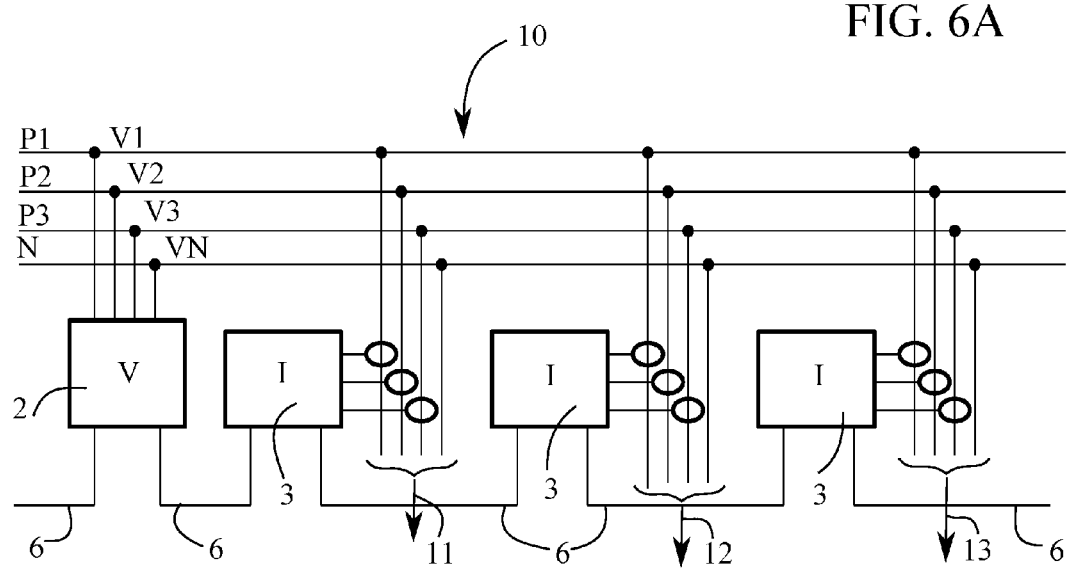
Figure 6B:
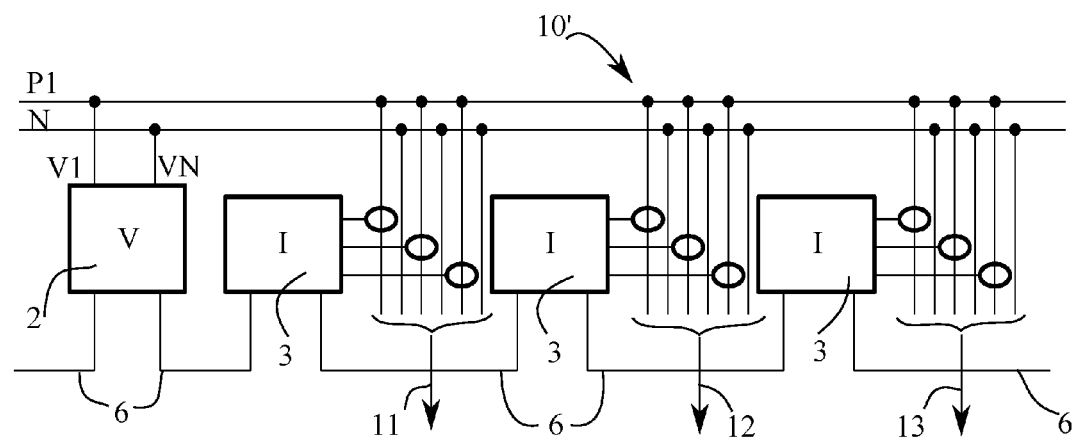

The voltages measuring device 2 includes in particular:
  an analog-to-digital converter 21 that transforms the analog values of the voltages measured by voltage sensors, represented by points on FIGS. 6A and 6B, into digital signals in order to communicate them to a processing unit 23,
  a frequency measuring module 22 that measures the frequency of the measured voltages to communicate them to processing unit 23,
  the processing unit 23 that processes the signals of the measured voltages and of the measured frequency to communicate processed signals on unidirectional communication pair 63 of a network cable 6 through a transmitter 20, and
  an adjustable oscillator 24 that provides the sampling frequency to analog-to-digital converter 21 and whose sampling frequency is adjusted by processing unit 23 according to the network frequency measurement provided by frequency measuring module 22.

The current measuring devices 3 include each in particular:
  an analog-to-digital converter 31 that transforms the analog values of the currents measured by current sensors, represented by tori on FIGS. 6A and 6B, into digital signals in order to communicate them to a processing unit 33,
  the processing unit 33 that processes the measured current signals with the voltage and frequency signals received through unidirectional communication pair 63 of network cable 6 by a receiver 30, to calculate measurement values usable by an operator and/or a monitoring unit S, such as power values, consumed energy values, power factor values, a harmonic current analysis, etc.
  an adjustable oscillator 34 that provides the sampling frequency to analog-to-digital converter 31 and whose sampling frequency is adjusted by processing unit 33 according to the phase shift measurement provided by a phase shift measuring unit 35, and
  the phase shift measuring unit 35 that receives data from oscillator 34 and receiver 30 to communicate with processing unit 33 and modify if necessary the sampling frequency of the current measurements.

Referring more specifically to FIGS. 1, 6A and 6B, the voltages measurement device 2 is installed upstream of branches 11, 12, 13, N of electrical network 10, which can be poly-phase (FIG. 6A) or single-phase (FIG. 6B). It performs the measurement of voltages V1, V2, V3, VN on phase conductors P1, P2, P3, and on neutral conductor N, if any, of electrical network 10, by means of any existing voltage sensor that allows delivering a signal representative of the measured voltage, this voltage sensor can be with or without contact, such as direct voltage taps, capacitive sensors, electric field sensors, or similar.

The current measuring devices 3 are installed each on one of branches 11, 12, 13, N of electrical network 10 and perform the measurement of current I on each phase conductor P1, P2, P3 of electrical network 10. Currents measurement can be performed by means of any existing current sensor that allows delivering a signal representative of the measured current, such as for example current transformers as illustrated in FIGS. 6A and 6B, Rogowski coils, magnetic field measurement-based sensors such as Hall effect or fluxgate-type magnetometers, or similar.

Figure 2:
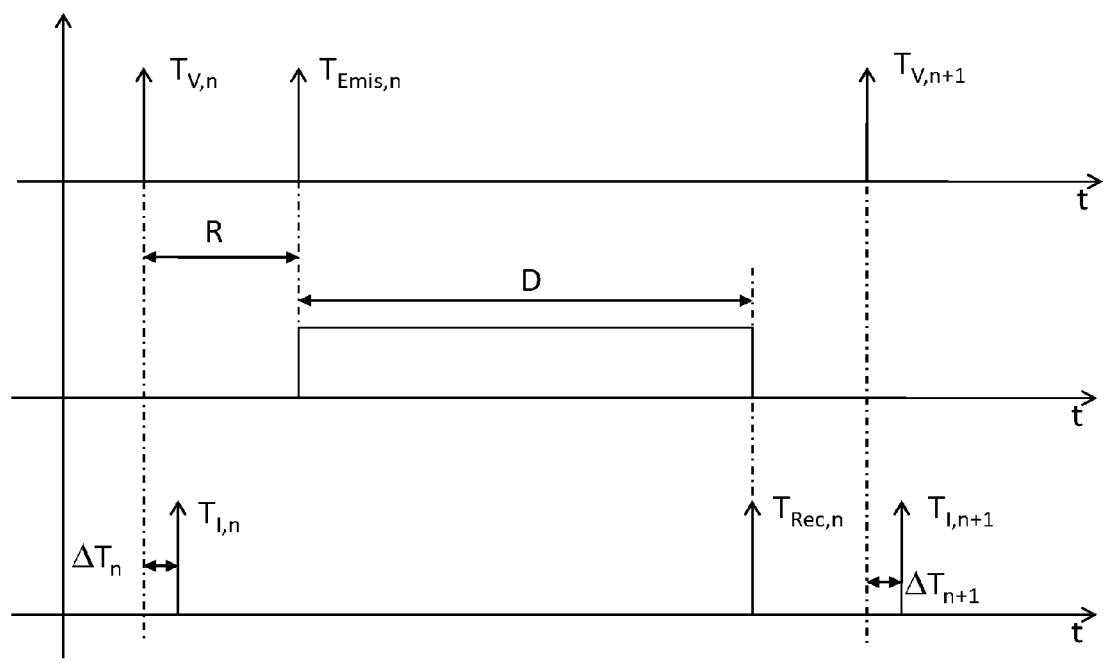
FIG. 2 is a diagram showing the synchronization of the voltage and current measurements sampling on a time scale.

Voltages and currents measurements take place periodically by sampling to transmit digitally usable information frames on unidirectional communication pair 63 of network cables 6. FIG. 2 allows illustrating this measuring method, which has the goal of reaching a very high synchronization degree between the voltage samples and the current samples compared to the known systems. The upper line of the diagram represents the activity of voltages measuring device 2, the lower line of the diagram represents the activity of current measuring devices 3 and the median line of the diagram represents the voltage samples forwarded on unidirectional communication pair 63.

The sampling frequency of the voltage measurements is determined by oscillator 24 and is advantageously, but not necessarily, controlled by the frequency of electrical network 10 to be analyzed, for example equal to 50 Hz. This control is particularly advantageous if a harmonic analysis of the measured voltages and currents must be performed simultaneously, hence the interest of frequency module 22, which communicates the network frequency measurement to processing unit 23, allowing it to adjust the sampling frequency by acting on oscillator 24.

Voltages measuring device 2 samples the voltages at moment Tv,n and transmits, with a fixed transmission delay R with respect to voltages sampling moment Tv,n, an information frame of duration D on unidirectional communication pair 63 of network cables 6 connecting voltages measurement device 2 to current measuring devices 3 through transmitter 20 and receivers 30.

Simultaneously, the current measuring devices 3 sample the currents at moment $T_{I,n}$ and receive all at the same time, except for the propagation delay in network cables 6, the information frame of voltages measuring device 2. They also have means for determining the reception moment $T_{rec,n}$ of the voltage samples information frame in processing unit 33.

Preferably, but not exclusively, the reception moment $T_{rec,n}$ of the voltage samples data frame corresponds to the last status change of the information frame, that is to say the end of its transmission. Knowing duration D of the information frame, which is generally an element of data known by current measuring devices 3, current measuring devices 3 calculate the time difference $\Delta T_n$ between voltages sampling moment $T_{v,n}$ and the corresponding currents sampling moment $T_{I,n}$. This difference $\Delta T_n$ is evaluated by:

$$\Delta T_n = T_{I,n} - T_{v,n} = T_{I,n} - T_{rec,n} + R + D$$

If difference $\Delta T_n$ is positive, as illustrated in FIG. 2, this means that currents sampling is lagging behind voltages sampling and that the currents sampling frequency must therefore be accelerated to reduce this lag. Conversely, if difference $\Delta T_n$ is negative, the currents sampling frequency must be reduced. The adjustment of the sampling frequency is preferably calculated using a proportional/integral-type controller integrated in processing unit 33 in function of the data provided by phase shift module 35. Processing unit 33 controls consequently adjustable oscillator 34 that will oscillate at the sampling frequency imposed by processing unit 33.

To make sure that duration D between the beginning and the end of the voltage samples information frame is fixed, the information frame can always end with an end-of-message bit. This method is particularly adapted to the use of modern micro controllers including fast asynchronous serial receivers, generally called UART, systems for direct data transfer to the memory, generally called DMA, and duration measuring units. One can also know duration D of the information frame by including this information in the frame itself, thus allowing for frames with variable durations. However, in this case, information processing in processing units 33 is more complex and can lead to the use of more powerful micro controllers than necessary.

Each current measuring device 3 then performs, based on the voltage samples received from voltages measuring device 2 through unidirectional communication pair 63 and on current samples obtained locally at almost identical moments, the same power, energy, etc. calculations as if the current and voltage samples had all been obtained synchronously locally by a classical combined measuring device. Thus, from the point of view of a supervision unit, nothing distinguishes measuring equipment 1 from a classical combined measuring device that measures directly the voltages and currents on each phase of the network.

There are numerous interests in such architecture:
the necessary computing power is distributed according to the actual number of current circuits to be processed,
current measuring devices 3 can be positioned as close as possible to the load to be analyzed, therefore reducing the wiring lengths between the sensor and the measuring device, which ensures better immunity to electromagnetic disturbances, and
the wiring achievement and the wiring check are greatly simplified.

The sampling frequency is of course adapted to the bandwidth of the harmonic analysis, which is generally in the order of 2 to 3 kHz. By way of indication, the sampling frequency range can be comprised between 1 kHz and 20 kHz, with a regulation accuracy $\Delta T_n$ in the order of 1 μs. A sampling frequency in the order of 5 kHz to 10 kHz is reasonable. In more basic applications, one can consider a sampling frequency in the order of 2 kHz, which allows including harmonics up to approximately 750 Hz.

To keep a good measuring accuracy, the voltage samples must be transmitted with a sufficient resolution. In order to simplify processing, one generally chooses a whole number of bytes for data representation, which leads to represent the voltages preferably on 8 or 16 bits. But one can also consider intermediate representation sizes to optimize the use of the bandwidth of unidirectional communication pairs 63.

Depending on the needs of the considered application, one can also choose to transmit the values of the voltages between phase and neutral, regardless whether this neutral is measured or virtual, or the voltages of the phases and of the neutral with respect to a reference potential of the electrical network, this reference potential being generally, but not necessarily, the earth of the installation.

Hereafter, we will consider an application allowing a harmonic analysis up to approximately 3 kHz and a 16-bit representation of the voltage data, with a transmission of the voltages with respect to a reference potential. Nevertheless, other choices can be made depending on the considered application.

The bandwidth necessary for transmitting the voltage samples of a three-phase network 10 with neutral (FIG. 6A) with respect to the reference potential, that is to say four voltage values per sampling moment, with a 16-bit representation and a 10 kHz sampling frequency, compatible with a 3 kHz bandwidth, represents a raw data volume in the order of 640 kbit/s. To ensure a certain reliability in transmission, it is customary to add control information, for example a sequence number on one-byte and also a check sum on one-byte, which results in a raw bit rate in the order of 800 kbits/s. As the operation of the various devices 2-5 is asynchronous, one prefers using an asynchronous-type link characterized by the presence of at least one start bit and one stop bit on every byte, which leads approximately to a 1 Mbits/s bit rate for the link. This bit rate is easily accessible today, at a reduced cost, using specialized integrated circuits compliant with standard RS485 and powerful low-cost micro controllers able to process efficiently bit rates of this kind, while allowing a total length of unidirectional communication pair 63 of network cables 6 exceeding 100 m. Depending on the applications, it can nevertheless be envisaged to reduce this bit rate to increase the distance allowed for unidirectional communication pair 63 by reducing the size of the voltage samples, for example from 16 bits to 8 bits, or by reducing the sampling frequency, or by combining these two solutions. To limit slightly the bandwidth or reduce the real-time load linked with the reception of the voltage samples, one can also transmit the samples in packets of N sampling moments, N having a value from 1 to some tens. However, the higher the value of N, the slower the response of the system to sampling frequency changes.

In such measuring equipment 1, a certain number of additional elements of information linked to network and equipment configuration need to be known by all connected devices 2-5, for example and non-exhaustively, the rated voltage of network 10, the rated frequency of network 10, the network connection type: with or without neutral, the network type: single-phase or three-phase, etc. This additional information is advantageously transmitted on the same unidirectional communication pair 63 as the voltage samples. Furthermore, it is interesting to be able to synchronize the voltage and current measuring samples to facilitate their analysis. This synchronization information, called synchronization pulses, is also advantageously transmitted on this same unidirectional communication pair 63. This information may be synchronization pulses for effective and power values measurements, event capture pulses. By event, one means waveforms that may be either a succession of current value samples or a succession of effective current values, so that all current measuring devices 3 perform the effective and power value measurements on the same time intervals and capture the waveforms on the same time interval. Finally, if voltages measuring device 2 has a clock, date and time are also advantageously transmitted on this same unidirectional communication pair 63.

Considering the relatively high bit rate for the transmission of the voltage samples on unidirectional communication pair 63 and the planned wiring lengths (some tens of meters), it is indispensable to control the topology of this wiring, which must have a bus-type shape with connection lines as short as possible. For this reason, the invention prefers a simple chaining of devices 2-5 to each other by network cables 6 and suitable connectors 60, 61, as explained above.

Nevertheless, in a first embodiment variant, one can group only the electrical power supply and the fast unidirectional communication dedicated to voltage samples transmission in a same network cable 6. In this case, the standardized bidirectional communication link uses a separate wiring. This approach is interesting if the electrical characteristics required by the bidirectional communication link are too different from those required for the unidirectional communication link dedicated to the voltage samples. In this case, the bidirectional communication link is galvanically isolated from the electrical power supply and from the unidirectional communication link for the voltage samples in every measuring device 3. The power supply voltage will be chosen sufficiently low to allow realizing non-isolated, compact power supplies, that will be high enough to allow forwarding a reasonable power on network cables 6 while allowing a distance in the order of 100 m between the power supply connection point and devices 2-5. A rated power supply voltage of 24V is a good compromise, but any voltage compatible with the criteria above can be considered.

In a second embodiment variant, one simplifies the wiring as much as possible by combining in a same network cable 6 all functions connecting devices 2-5 to each other, that is to say the low-voltage electrical power supply, the standardized bidirectional communication link and the unidirectional communication link dedicated to voltage samples transmission. Three pairs of conductive wires 62, 63, 64 are then necessary. But, as the most common UTP-type network cables 6 include four pairs of conductive wires, this last configuration is preferably chosen, as explained above. In this case, the electrical power supply can be forwarded on two pairs of conductive wires, which allows doubling the transportable power. The galvanic isolation between the electrical power supply and the bidirectional communication link is then not required any more in each device 2-5 of equipment 1. This galvanic isolation 72 is necessary only at one point that is to say in connection device 4 that ensures the electrical interface between measuring equipment 1 and supervision unit S. This way, measuring equipment 1 can be integrated without problem in an existing supervision system.

POSSIBILITIES FOR INDUSTRIAL APPLICATION

The choice of transmitting voltage measurements between phases P1, P2, P3 and neutral N or between phases P1, P2, P3, the neutral being used as the reference potential, depends on the considered application. The transmission of voltage measurements with respect to a reference potential always allows retrieving all useful voltages by difference, but it requires slightly more bandwidth. In particular one application benefits from the transmission of voltage measurements with respect to a reference potential: the earth of the electrical network. It relates to the search for an isolation fault in a neutral stand-alone system. In this application type, an additional device (not represented) allows injecting in network 10 an earth fault current called locating current with a frequency much lower than the frequency of the network. This additional device can be for example a voltage generator with current limitation. One can also create voluntarily a fault between the network and the earth to force the circulation of a fault current. There are thus different techniques for injecting or creating an earth fault current that will tend to be distributed among all network branches according to the respective fault impedances of each branch.

If current measuring devices 3 are designed to receive the signals from a differential earth current sensor, generally called location torus, said current measuring devices 3 can in this case determine the earth leakage impedance from the voltage measurement on any of phase conductors P1, P2, P3 active with respect to earth and from the earth leakage current. In this specific application, controlling the sampling frequency with the frequency of the measured network is particularly interesting. In fact, the use of simple moving average filters allows removing totally the signals at network frequency and multiples of this frequency, which have generally a large amplitude compared to the very low-frequency signals used for determining the earth leakage impedance.

Figure 7:
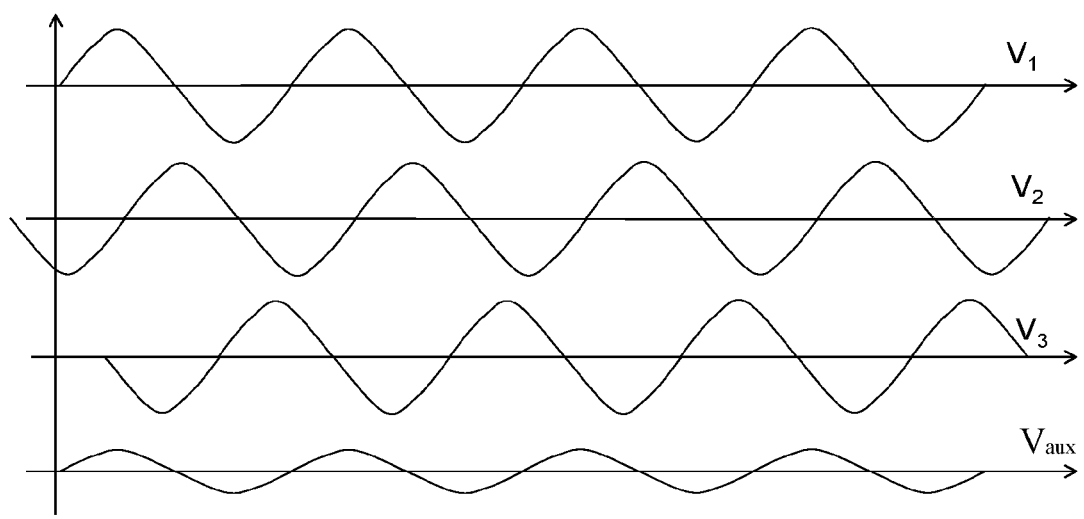
FIG. 7 is a diagram of the voltage signals of the three-phase network of FIG. 6A and of the auxiliary voltage signal measured by a current measuring device provided with a correlation module searching automatically the voltage path that corresponds best to the measured auxiliary voltage.

Another advantage of the transmission of voltage measurements with respect to a reference potential is the possibility to detect automatically which phase P1, P2, P3 of network 10 the current sensor of a current measuring device 3 is connected to, and this even in the absence of any load current. This is possible provided that current measuring device 3 supplies an auxiliary voltage signal that reproduces faithfully the shape of the voltage of the monitored phase conductor. For this automatic detection function, the auxiliary voltage signal Vaux must not exceed a maximum phase shift in the order of a few degrees with respect to network frequency, while its amplitude is not important. This auxiliary voltage signal Vaux can be obtained by means of a non-contact voltage sensor (not represented), particularly inaccurate for the amplitude, such as a capacitive coupling or an electric field measurement. In such conditions, current measuring device 3 equipped with such voltage sensor comprises a correlation module (not represented) that allows detecting automatically which voltage path corresponds to the current sensor by defining which of the rated voltages V1, V2, V3 connected to the processing unit shows the highest correlation with auxiliary voltage signal Vaux. The diagram of FIG. 7 shows as an example the correlation that exists between the auxiliary voltage signal Vaux obtained by a voltage sensor integrated in current measuring device 3 and voltage path V1 that corresponds to phase P1 of electrical network 10 on which the current sensor is installed. This correlation method is applied the same way for the other phases P2 and P3.

Measuring equipment 1 according to the invention can also have the function of evaluating the energy losses of the network cables. In this case, current measuring devices 3 comprise an additional voltage sensor (not represented) to measure the effective local voltage on the branches of the analyzed network, such as a direct voltage tap. Processing unit 33 can calculate locally the energy consumption and compare it with the energy consumption calculated from the centralized voltage measurements in order to evaluate the energy losses in the cables of said network.

Another application of measuring equipment 1 according to the invention relates to the case of an emergency electrical network such as for example a generator set provided to replace the main electrical network in case of a failure. In this case, measuring equipment 1 is completed with another voltages measurement device 2 that is connected to the emergency electrical network (not represented) and connected by network cable 6 to voltages measuring device 2 of the main network to transmit to this other voltages measuring device 2 the voltage measurement samples obtained by first voltages measuring device 2 or vice-versa. Processing units 23 allow comparing the amplitude and phase of the two networks with the goal of connecting both networks together when the differences are low enough to allow switching from one of them to the other without interruption. In this configuration, the voltage measurement device dedicated to the emergency network can become the master and supply the required voltage samples to current measuring devices 3.

This description shows clearly that the invention allows reaching the goals defined, that is to say an equipment 1 for measuring the consumption of the branches of an electrical network 10 that is particularly simple to implement, able to be integrated in an existing supervision system, configured to reach very high measuring accuracies and offer flexibility of use in function of the considered applications.

The present invention is not restricted to the example of embodiment described, but extends to any modification and variant which is obvious to a person skilled in the art while remaining within the scope of the protection defined in the attached claims.

The invention claimed is:

1. A method of measuring the energy consumption of branches (11, 12, 13, N) of an electrical network (10), the method comprising:

measuring voltages of the network in a centralized manner by a single voltage measuring device (2) connected upstream of the branches of the network, measuring current on at least one of the branches of the network by a dedicated current measuring device (3), communicating, through a communication link, the voltage measurements to the current measuring device (3), and calculating, in the current measuring device (3), at least the energy consumption of the at least one of the branches of the network, performing the measurements of the voltage of the network by the single voltages measuring device (2) by sampling the voltage at a moment (Tv,n) at a first sampling frequency, transmitting the voltage samples to the current measuring device (3) through the communication link at the moment the voltage is sampled (Tv,n), performing the measurements of the current of the at least one of the branches of the network by the current measuring device (3) by sampling the current at a moment (Ti,n) at a second sampling frequency, comparing time difference existing between the sampling moment of the voltage (Tv,n) and the sampling moment of the current (Ti,n) since the voltage and the current measuring devices (2, 3) operate asynchronously, and adjusting at least one sampling frequency with respect to the other to bring the time difference existing between the sampling moment of the voltages (Tv,n) and the sampling moment of the currents (Ti,n) close to zero.

2. The method according to claim 1, further comprising transmitting, via the voltage measuring device (2), the voltage samples on the communication link at the voltage sampling moment (Tv,n) using an information frame of duration (D), receiving, via the current measuring device (3), the voltage samples and detecting the moment of an end of the reception of the information frame (Trec,n), calculating, via the current measuring device (3), the voltage sampling moment (Tv,n), calculating, via the current measuring device (3), the time difference (ΔTn) between the current sampling moment (Ti,n) and the voltage sampling moment (Tv,n), and adjusting, via the current measuring device (3), its own sampling frequency in order to bring the time difference close to zero by increasing the sampling frequency if the time difference (ΔTn) is positive and reducing the sampling frequency if the time difference (ΔTn) is negative.

3. The method according to claim 2, further comprising transmitting, via the voltage measurement device (2), the voltage samples on the communication link with a fixed delay (R) with respect to the voltage sampling moment (Tv,n) using an information frame of a known duration (D), calculating, via the current measurement device (3), the voltage sampling moment (Tv,n) from the known data (D) and (R) according to the formula:

$$Tv,n = Trec,n - D - R, \text{ and}$$

calculating, via the current measurement device (3), the time difference (ΔTn) between the current sampling moment (Ti,n) and the voltage sampling moment (Tv,n) according to the formula:

$$\Delta Tn = Ti,n - Tv,n = Ti,n - (Trec,n + D + R).$$

4. The method according to claim 1, further comprising using the communication link to transmit, from the voltage measuring device (2) to the current measuring device (3), additional information chosen in the group consisting of the single-phase or three-phase network type, with or without neutral, the rated voltage of the network, the rated frequency of the network, date and time, synchronization pulses of effective and power values measurements, event capture signals.

5. The method according to claim 1, further comprising transmitting the voltage measurement samples in packets of N samples.

6. The method according to claim 1, further comprising selecting a fixed sampling frequency of the voltage measurements.

7. The method according to claim 1, further comprising controlling the sampling frequency of the voltage measurements by the frequency of the analyzed electrical network (10).

8. The method according to claim 1, further comprising transmitting the voltage measurement samples in digital form on a network cable (6) connected to the current measuring device (3), and the network cable (6) comprising at least a first pair of conductive wires, called a unidirectional communication pair (63).

9. The method according to claim 8, further comprising using the same network cable (6) to provide an electrical power supply to the voltage and the current measuring devices (2, 3) using a second dedicated pair of conductive wires, called a power supply pair (62).

10. The method according to claim 8, further comprising using the same network cable (6) to connect the voltage and the current measuring devices (2, 3) to a monitoring unit (S) by a third dedicated pair of conductive wires, called a bidirectional communication pair (63).

11. The method according to claim 1, further comprising measuring the voltage of the electrical network (10) with respect to a reference potential formed by an earth of the network, injecting an earth fault current in the analyzed network,
measuring the injected fault current, and
determining an earth leakage impedance of at least one of the branches of the analyzed network.

12. The method according to claim 1, further comprising supplying, via the current measuring device (3), an auxiliary signal representative of a voltage of a conductor on which the current is measured, and the auxiliary voltage signal being used for matching the voltage measurement with the current measurement performed on a same conductor of the electrical network (10) and automatically compensate for connection errors.

13. The method according to claim 1, further comprising measuring, via the current measuring device (3), a local voltage on the network branch to calculate locally at least the energy consumption and compare the energy consumption with the energy consumption calculated from the centralized voltage measurements to evaluate the energy losses in the network.

14. The method according to claim 1, further comprising using at least one other voltage measuring system (2) connected to another electrical network to be analyzed, transmitting to one of the voltages measuring devices (2), through the communication link, the voltage measurement samples obtained by the at least one other voltage measuring system (2), and comparing an amplitude and a phase of both analyzed electrical networks to connect the electrical networks together when the differences are sufficiently low.

15. The method according to claim 14, further comprising, when both electrical networks (10) are connected together, any one of the voltage measuring devices (2) takes the control of the communication link and is used for measuring the voltage of the corresponding network.

16. Measuring equipment for the consumption of branches (11, 12, 13, N) of an electrical network (10) implementing the measuring method according to claim 1, the measuring equipment comprising:

a single voltage measuring device (2), connected upstream of the branches of the network to be analyzed, for measuring the voltages of the network in a centralized manner, at least one dedicated current measuring device (3), connected to at least one of the branches of the network, for measuring currents on the at least one of the branches of the network, the voltage and the current measuring devices (2, 3) being connected to one another by at least one communication link allowing communication of the voltage measurements to the current measuring device (3), which comprises at least one processing unit (33) for calculating an energy consumption of the at least one of the branches of the network, wherein the single voltage measuring device (2) comprises means (21, 24) for performing the network voltage measurements by sampling the voltages at a moment (Tv,n) at a first sampling frequency, and the voltages measuring device (2) comprises means for transmitting the voltage samples to the current measuring device (3) through the communication link at voltage sampling moment (Tv,n), the dedicated current measuring device (3) comprises means (31, 34) for performing the measurements of the current of the at least one of the branches of the network by sampling the currents at a moment (Ti,n) at a second sampling frequency, the measuring equipment comprises means (35) for comparing a time difference existing between the sampling moment of the voltages (Tv,n) and the sampling moment of the currents (Ti,n), since the voltage and the current measuring devices (2, 3) operate asynchronously, and the voltage and the current measuring devices (2, 3) comprise means (23, 33) for adjusting at least one sampling frequency with respect to the other to bring the time difference, existing between the sampling moment of the voltages (Tv,n) and the sampling moment of the currents (Ti,n), close to zero.

17. The measuring equipment according to claim 16, wherein the voltage measuring device (2) comprises at least one adjustable oscillator (24) arranged to define the sampling frequency of the voltage measurements, a frequency module (22) arranged to measure the frequency of the analyzed network and at least one processing unit (23) arranged to process at least the voltage samples and the frequency measurements of the network, and the adjustable oscillator (24) is controlled by the processing unit (23).

18. The measuring equipment according to claim 16, wherein the current measuring device (3) comprises at least one adjustable oscillator (34) arranged to define the current measurement sampling frequency, at least one processing unit (33) arranged to calculate at least the energy consumed by the branch of the network from the voltage samples received through the communication link and from the current samples measured on the branch, and a phase shift module (35) arranged to measure time difference existing between the voltages sampling moments (Tv,n) and the currents sampling moments (Ti,n) and to control the adjustable oscillator (34) in order to adjust the current measurements sampling frequency so as to synchronize the current measurements sampling frequency with the voltage measurements sampling frequency.

19. The measuring equipment according to claim 18, wherein the current measuring device (3) comprises an auxiliary voltage sensor arranged to measure an auxiliary signal representative of the voltage of the conductor on which the current measuring device (3) measures the current, and the processing unit (33) comprises a correlation module arranged to match the voltage measurement with the current measurement performed on a same conductor of the electrical network (10).

20. The measuring equipment according to claim 18, wherein the current measuring device (3) comprises a voltage sensor for measuring the local voltage on the at least one of the branches of the network and the processing unit (33) is arranged to calculate locally at least the energy consumption and compare the energy consumption with the energy consumption calculated from the centralized voltage measurements to evaluate the energy losses in the cables of the network.

21. The measuring equipment according to claim 16, wherein the communication link is made of at least one pair of conductive wires, called unidirectional communication pair (63) provided in a network cable (6), for transmitting the voltage samples in digital form, and the network cable (6) is arranged to connect the centralized voltages measuring device (2) to the dedicated current measuring device (3) through suitable connectors (60, 61).

22. The measuring equipment according to claim 21, wherein the network cable (6) comprises a second dedicated pair of conductive wires, called power supply pair (62), arranged to provide an electrical power supply to the voltage and the current measuring devices (2, 3).

23. The measuring equipment according to claim 21, wherein the network cable (6) comprises a third dedicated pair of conductive wires, called bidirectional communication pair (63), arranged to connect the voltage and the current measuring units (2, 3) to a monitoring unit (S).

24. The measuring equipment according to claim 21, wherein the measuring equipment comprises means for injecting an earth fault current in the analyzed network, the current measuring device (3) comprises a sensor arranged to measure the earth fault current, and the processing unit (33) is arranged to determine the earth leakage impedance of the at least one of the branches of the network based on the voltage samples received through the unidirectional communication pair (63) and from the earth leakage current samples measured locally.

25. The measuring equipment according to claim 21, wherein the measuring equipment comprises at least one line termination device (5) located at the end of the unidirectional communication pair (63).

26. The measuring equipment according to claim 16, wherein the measuring equipment comprises at least one other voltage measuring device (2) connected to another electrical network (10) to be analyzed, and this at least one other voltage measuring device (2) is connected to the main network voltage measuring device (2) through the communication link.

27. The measuring equipment according to claim 16, wherein the measuring equipment comprises a number (N) of dedicated current measuring devices (3) corresponding to a number (N) of branches of the electrical network (10) to be analyzed, and all of the current measuring devices (3) are connected to a centralized voltage measuring device (2).

28. The measuring equipment according to claim 16, wherein the measuring equipment comprises at least one connection device (4) located upstream of the branches of the electrical network to be analyzed and arranged to act as the electrical interface between the voltage and the current measuring devices (2, 3), on the one hand, and at least a power supply (8) and a supervision unit (S), on the other hand.

* * * * *